United States Patent [19]

Necoechea

[11] Patent Number: 4,594,544
[45] Date of Patent: Jun. 10, 1986

[54] PARTICIPATE REGISTER FOR PARALLEL LOADING PIN-ORIENTED REGISTERS IN TEST EQUIPMENT

[75] Inventor: R. Warren Necoechea, Milpitas, Calif.

[73] Assignee: Fairchild Camera and Instrument Corporation, San Jose, Calif.

[21] Appl. No.: 472,427

[22] Filed: Mar. 7, 1983

[51] Int. Cl.$^4$ .................. G01R 15/12; H03K 17/00
[52] U.S. Cl. ............................. 324/73 AT; 328/97
[58] Field of Search ............ 324/73 R, 73 AT, 73 PC; 364/550, 551, 579, 580, 479, 480, 481, 486; 371/27; 328/96, 97, 105

[56] References Cited

U.S. PATENT DOCUMENTS 3,651,315  3/1972  Collins ........................ 324/73 AT
4,212,075  7/1980  Cleversey et al. ............ 324/73 AT

*Primary Examiner*—Ernest F. Karlsen
*Assistant Examiner*—Walter E. Snow
*Attorney, Agent, or Firm*—Theodore S. Park; Robert C. Colwell

[57] ABSTRACT

An automatic test system for parallel loading of data into pin registers 100 associated with pins of a device being tested includes data bus 130 for transmitting data; an address bus 120 for transmitting addresses; a set of pin registers 100, each having a unique address and each coupled to receive information from the data bus 130; a participate register 150 coupled to data bus 130 and to each of registers 100 for enabling selected ones of registers 100 to receive data from the data bus at the same time; an address decoder 110, 180 connected to the address bus 120, to each of registers 100, and to the participate register 150, for enabling one of the pin registers 100 or the participate register 150 to receive data from the data bus, the data for the participate register 150 comprising the addresses of each of the selected ones of pin registers 100 which are to receive data from the data bus in parallel.

11 Claims, 1 Drawing Figure

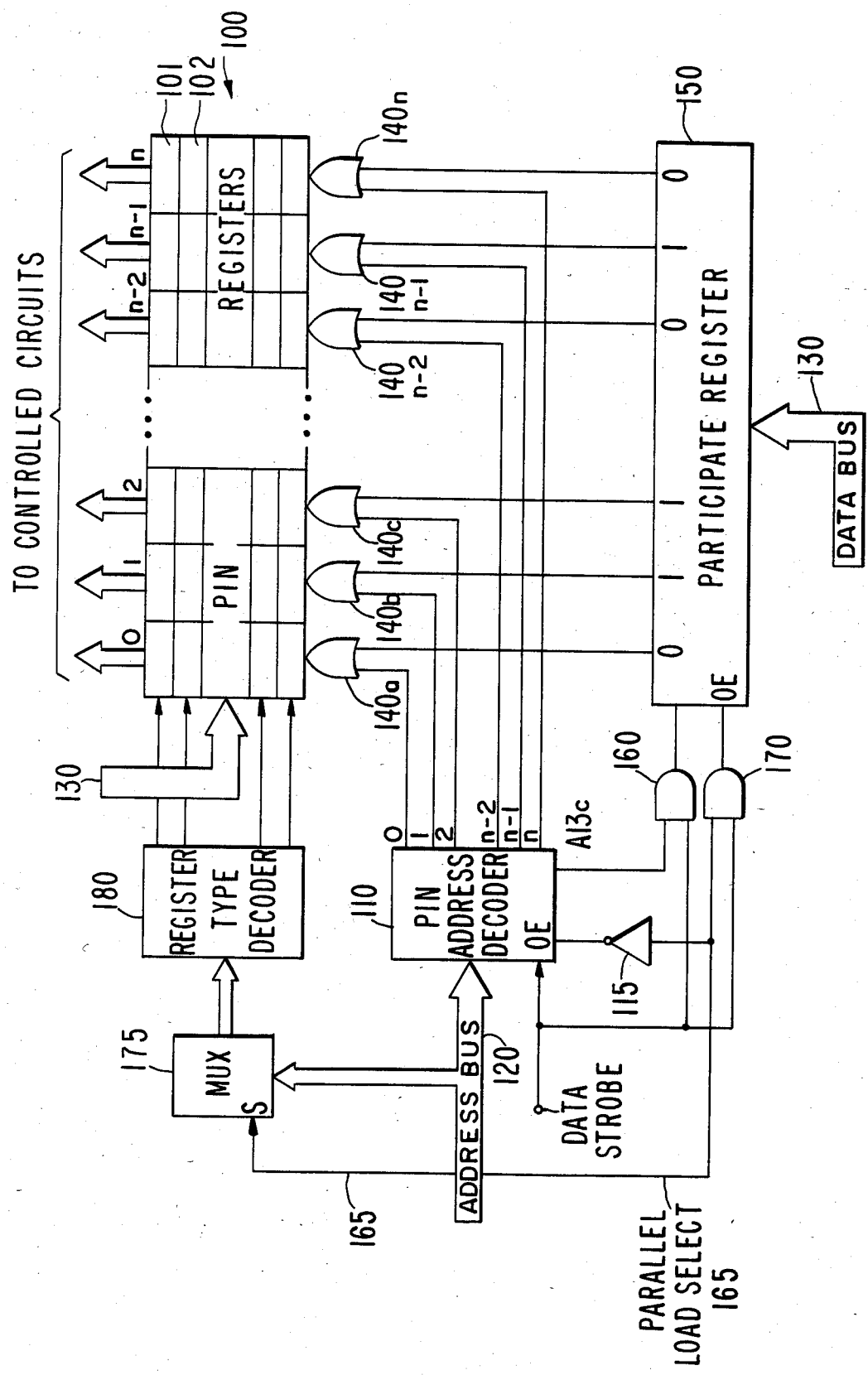

PARTICIPATE REGISTER FOR PARALLEL LOADING PIN-ORIENTED REGISTERS IN TEST EQUIPMENT

BACKGROUND OF THE INVENTION

1. Field of the Invention

This invention relates to automatic test systems for testing electronic components, and in particular, to a participate register for parallel loading of data in pin oriented registers in automatic test equipment.

2. Description of the Prior Art

In automatic test equipment for the testing of integrated circuits, pin electronics interface circuits are coupled to the pins or other nodes of an electronic device being tested. Through the pins, stimuli signals are supplied to the device under test, and output signals from the device under test are detected and measured. Usually, the stimuli signals represent logic states or analog voltages or currents which are desired to be impressed on the pins of the device under test as a parallel pattern, with the resulting output signals checked in parallel.

The interface circuits function as an interface between the computer controlling the test system and the individual pins of the device under test. The interface circuits receive reference voltages and digital data from other circuits in the test system, and then through drivers associated with each interface circuit switch these voltages or data onto desired input pins of the device under test under control of a program stored in the test system computer. Correspondingly, the interface circuits receive voltages or data from output pins of the device under test and supply that data to a comparator circuit which compares the signal received with the proper response stored in the program of the test system computer.

In typical automatic test systems several registers associated with each pin of the device being tested store information concerning attributes to be controlled by those registers. For example, a relay register associated with each pin store information to control the state of relays associated with the pin. Other registers associated with each pin store information concerning reference levels, pin modes of operation, connection of a precision analog measurement unit, etc. In the prior art to supply data to these pin registers, each register associated with each pin was sequentially addressed and the desired data supplied. Because many of the pin registers received identical data, loading this data into registers required long sets of repetitive instructions thereby causing a lengthy set-up period during which the automatic test equipment was unavailable for testing electronic components.

SUMMARY OF THE INVENTION

This invention provides an apparatus for an automatic test system by which individual registers associated with different pins, but which are to receive the same data, may be selected and enabled as a group to simultaneously receive that data. In this manner the sequential addressing of individual registers required by the prior art is eliminated except for those data transfers where only one register is to receive the information. The parallel loading of groups of registers with common data greatly decreases the set-up time required by the test system.

In one embodiment an automatic test system capable of parallel loading of data into pin registers comprises a data bus for transmitting data; an address bus for transmitting addresses; a plurality of pin registers, each having a unique address and each coupled to the data bus; a participate register coupled to the data bus and to each of the pin registers for enabling a plurality of the pin registers to receive data from the data bus at the same time; address decoder means connected to the address bus, each of the pin registers, and to the participate register for enabling one of the pin registers or the participate register to receive data from the data bus, the data for the participate register comprising the addresses of each of the plurality of pin registers which are later to receive data from the data bus in parallel.

BRIEF DESCRIPTION OF THE DRAWING

The FIGURE is a block diagram illustrating an automatic test system with participate register of the preferred embodiment of this invention.

DETAILED DESCRIPTION OF THE PREFERRED EMBODIMENT

The Figure is a schematic drawing illustrating the preferred embodiment of this invention. Across the top of the Figure is a collection of pin registers 100 associated with pins 0,1,2.. n. The registers in each column control features associated with the corresponding pin. For example, the registers in column 2 will control circuits, relays, or other functions associated with pin 2 of a test fixture into which the device being tested is placed. Those registers in column n will control aspects of the operation of circuits coupled to pin n. The number of columns of pin registers is arbitrary and may be expanded or reduced depending upon the characteristics of the device being tested. For example, for a 16 pin integrated circuit, typically only pins 0 through 15 of the test fixture will be used, and consequently only pin registers in columns 0 through 15 of register set 100 will be used.

Each pin of the device being tested will usually have associated with it several pin registers that control different aspects of the signals supplied to or received from the device being tested. For example, in one automatic test system, for each pin a first register will be provided to control the relays associated with that pin, another register will control the connection of an analog precision measurement unit to the pin, two registers will control the pin mode of operation, and nine registers will allow setting of reference voltage and current levels for the pin. The relays, precision measurement units, pin modes of operation, reference levels and other parameters associated with each pin are controlled by the data stored in the particular pin registers corresponding to that individual pin.

In the prior art data were loaded into the pin registers in a serial or sequential fashion. That is, an address corresponding to the address of a particular pin register to which data was to be sent was supplied to an address decoder over an address bus. The address decoder would enable the addressed pin register and data on a data bus would then be supplied to that register and stored, where it could be retrieved by other devices to control their operation. As already discussed, this system was undesirably slow because it required repeat transmission of the same data for each pin register which was to receive that data.

In the preferred embodiment of this invention a participate register 150 is provided and connected to address decoder 110 through AND gate 160. This participate register 150 is also coupled to data bus 130, the data strobe gate 170, and to each of OR gates 140 as shown.

The participate register 150 functions as a rank oriented register which, in conjunction with register type decoder 180, controls which pin registers 100 will take part in a given parallel load of data from bus 130. All pin registers selected will then receive information in a single parallel loading operation.

The operation of the circuit shown in the Figure is as follows. To write data into the participate register 150, it is addressed by address bus 120 through pin address decoder 110 by the selection of a nonexistant pin register address such as A13C. This signal is supplied to the upper terminal of AND gate 160. The other terminal of gate 160 is coupled to the data strobe line, and at the next data strobe signal, data are supplied to participate register 150 from data bus 130. For the embodiment depicted, the participate register will comprise an n bit register. The hypothetical word shown in the Figure loaded into register 150 from data bus 130 is 011...010 as shown.

When the output of the participate register 150 is enabled using a selected address bit supplied on parallel load select line 165, the contents of register 150 will enable selected ones of OR gates 140. For the example shown in the Figure, if a "1" is considered to enable an OR gate, then OR gates 140b, 140c, and 140n-1 will be enabled simultaneously. These gates, in turn, will enable pin registers designated 1, 2, and 140n-1 to receive data simultaneously from data bus 130.

Multiplexer 175 and register type decoder 180, in response to signals from bus 120, will select one of rows 101, 102, etc. of pin registers to have selected registers enabled within it. The same address bit 165 which, through gate 170, enables the output of the participate register 150 also controls multiplexer 175. Multiplexer 175 receives addresses from address bus 120 as shown. When the parallel load select bit on line 165 is of appropriate state, the addresses supplied to decoder 180 through multiplexer 175 will be decoded to specify the type of register, e.g. relay registers 102, to take part in the parallel loading of data from bus 130. Thus only those of registers 102 also selected by the participate register 150 will receive data from bus 130.

Inverter 115 coupled to the output enable terminal OE of decoder 110 will disable decoder 110 when the output of participate register 150 is enabled. In this manner the group of pin registers selected by both register 150 and decoder 180 (e.g. Row 102 for pins 1, 2, and n-1) may be loaded in parallel, rather than serially, as in the prior art.

When the state of parallel load select line 165 is reversed, the output enable terminal OE of register 150 is disabled to allow the pin address decoder 110 to select the column of pin registers to which data from bus 130 will be supplied. The type of register receiving the data will be determined by the address supplied to decoder 180. Multiplexer 175 allows the same address bits from bus 120 to have two differing interpretations depending upon the state of the bit controlling line 165.

Parallel loading of data is particularly advantageous in the loading of data in automatic test systems because groups of pin registers often receive the same data to enable them to participate in the same measurement, specify the same relay combination, or perform other functions. Of course as many participate registers may be provided as desired with each having its own separate address. For example, one participate register may be provided to control one set of pin registers, and a second separate participate register provided to control other features.

The foregoing description of the preferred embodiment is intended to illustrate the invention, rather than limit it. The scope of the invention may be ascertained from the appended claims.

We claim:

1. An automatic test system comprising;
    a data bus for transmitting data;
    an address bus for transmitting addresses;
    a set of pin registers, each register having a unique address and having enabling means connected to receive a signal to enable that register to receive data from the data bus;
    a participate register having an enabling terminal, having input terminals coupled to the data bus, and having output terminals coupled to the enabling means of the pin registers for enabling a first plurality of the pin registers to receive data in parallel from the data bus; and
    address decoder means connected to receive address signals from the address bus, connected to each enabling means of each of the pin registers, and connected to the enabling terminal of the participate register for enabling one of the participate register or the pin registers to receive data from the data bus, the data for the participate register comprising the addresses of each of the first plurality of pin registers to receive data in parallel from the data bus.

2. A system as in claim 1 wherein the set of pin registers comprises a plurality of groups of pin registers, each of the groups being associated with a different pin of the automatic test system.

3. A system as in claim 2 wherein the enabling means comprises a first enabling node and a second enabling node, each node coupled to the register.

4. A system as in claim 2 wherein the address decoder means comprises:
    a register-type decoder coupled to the address bus and coupled to the address bus and connected to the first enabling node of each of the pin registers for enabling one register in each of the groups of pin registers to receive signals from the data bus; and
    a pin address decoder coupled to the second enabling node of each of the pin registers and coupled to receive signals from the address bus, wherein both the first and second enabling nodes must be enabled for a particular pin register to receive data.

5. A system as in claim 3 wherein the output terminals of the participate register are coupled to the second enabling nodes of the pin registers.

6. A system as in claim 5 wherein:
    the second enabling node of each of the groups of pin registers comprises an output terminal of a logic gate means; and
    the pin address decoder and the participate register are connected to supply signals to input terminals of the logic gate means.

7. A system as in claim 6 wherein the logic gate means comprises a plurality of OR gates.

8. A system as in claim 7 wherein the plurality of OR gates comprises a series of separate OR gates each having an output terminal connected to a different one of the groups of pin registers.

9. A system as in claim 2 further comprising a data strobe line connected to the address decoder for providing timing signals.

10. A system as in claim 1 wherein the address decoder includes means for disabling the pin address decoder whenever the participate register is enabled.

11. In a system including a data bus for transmitting data; an address bus for transmitting addresses; a set of pin registers, each having a unique address and each coupled to the data bus; a participate register coupled to the data bus and to each of the pin registers for enabling a plurality of the pin registers to receive data from the data bus in parallel; address decoder means connected to the address bus, to each of the pin registers and to the participate register for enabling the participate register or enabling one of the pin registers to receive data from the data bus, the data for the participate register comprising the addresses of each of the plurality of pin registers which are to receive data from the data bus in parallel, a method of supplying common data to a plurality of the pin registers comprising:

addressing the participate register;

supplying to the participate register addresses of pin registers which are to receive the common data;

enabling ones of the set of pin registors with the data in the participate register; and supplying the common data in parallel to each of the thereby enable pin registers.

* * * * *

UNITED STATES PATENT AND TRADEMARK OFFICE
CERTIFICATE OF CORRECTION

PATENT NO. : 4,594,544
DATED : June 10, 1986
INVENTOR(S) : R. Warren Necoechea and Jamal Halem Alrawi It is certified that error appears in the above—identified patent and that said Letters Patent is hereby corrected as shown below:

On the title page, left-hand column, at about line 6 and 7, after "[75] Inventor: R. Warren Necoechea, Milpitas, Calif." insert --, and Jamal Halem Alrawi, Milpitas, Calif.--

Signed and Sealed this

Eighteenth Day of November, 1986

Attest:

DONALD J. QUIGG

*Attesting Officer*  *Commissioner of Patents and Trademarks*